(12) United States Patent
Lazzarino

(10) Patent No.: US 10,707,198 B2
(45) Date of Patent: Jul. 7, 2020

(54) PATTERNING A TARGET LAYER

(71) Applicant: IMEC VZW, Leuven (BE)

(72) Inventor: Frederic Lazzarino, Hamme-Mille (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/014,888

(22) Filed: Jun. 21, 2018

(65) Prior Publication Data

US 2018/0374837 A1 Dec. 27, 2018

(30) Foreign Application Priority Data

Jun. 22, 2017 (EP) ..................................... 17177328

(51) Int. Cl.
| | | |
|---|---|---|
| *H01L 23/528* | (2006.01) | |
| *H01L 27/02* | (2006.01) | |
| *H01L 21/033* | (2006.01) | |
| *H01L 21/02* | (2006.01) | |
| *H01L 21/768* | (2006.01) | |

(52) U.S. Cl.
CPC .... *H01L 27/0207* (2013.01); *H01L 21/02518* (2013.01); *H01L 21/0337* (2013.01); *H01L 21/0338* (2013.01); *H01L 21/76816* (2013.01); *H01L 21/76877* (2013.01); *H01L 23/528* (2013.01)

(58) Field of Classification Search
CPC ........... H01L 21/02518; H01L 21/0337; H01L 21/0338; H01L 21/76816; H01L 21/76877; H01L 23/528; H01L 27/0207
See application file for complete search history.

(56) References Cited

U.S. PATENT DOCUMENTS

| | | | |
|---|---|---|---|
| 2009/0152645 A1 | 6/2009 | Tran | |
| 2010/0096719 A1* | 4/2010 | Lee | H01L 21/0332 257/506 |
| 2010/0184287 A1* | 7/2010 | Eom | H01L 21/0337 438/669 |
| 2016/0133464 A1* | 5/2016 | deVilliers | H01L 21/0338 438/695 |
| 2016/0293419 A1 | 10/2016 | Nam | |

OTHER PUBLICATIONS

European Search Report, European Patent Application No. 17177328. 6, dated Dec. 1, 2017, 9 pages.

* cited by examiner

*Primary Examiner* — Matthew C Landau
*Assistant Examiner* — Dmitriy Yemelyanov
(74) *Attorney, Agent, or Firm* — McDonnell Boehnen Hulbert & Berghoff LLP

(57) ABSTRACT

A method is provided for patterning a target layer, the method comprising: (i) forming above the target layer a line mask and a mandrel mask, wherein forming the line mask comprises forming parallel material lines extending in a longitudinal direction, wherein forming the mandrel mask comprises forming a mandrel mask having sidewalls including at least a first sidewall extending transverse to a plurality of the material lines; (ii) forming on the sidewalls of the mandrel mask a sidewall spacer including a first sidewall spacer portion extending along the first sidewall; (iii) partially removing the sidewall spacer such that a remainder of the sidewall spacer comprises at least a part of the first sidewall spacer portion; and (iv) subsequent to removing the mandrel mask, transferring into the target layer a pattern defined by the line mask and the remainder of the sidewall spacer.

16 Claims, 7 Drawing Sheets

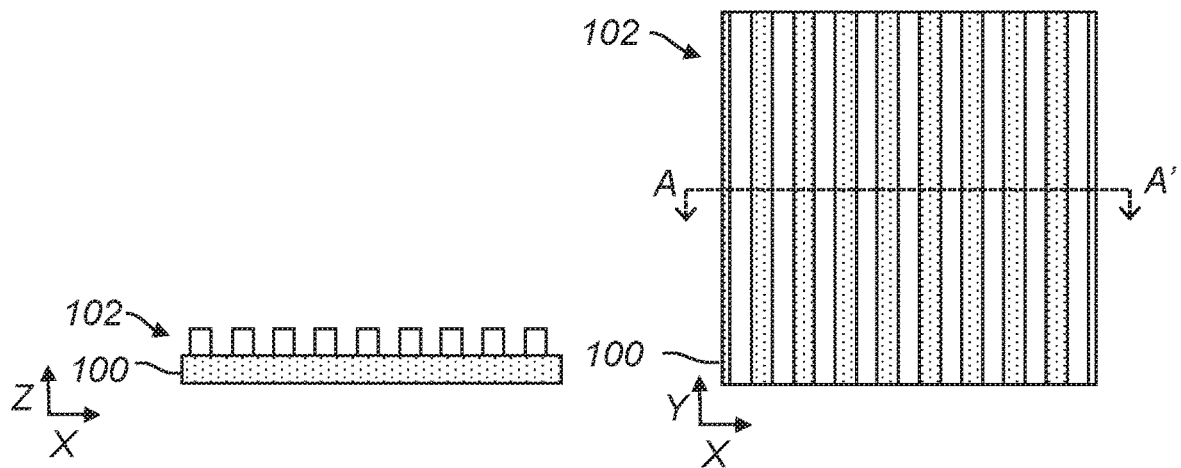
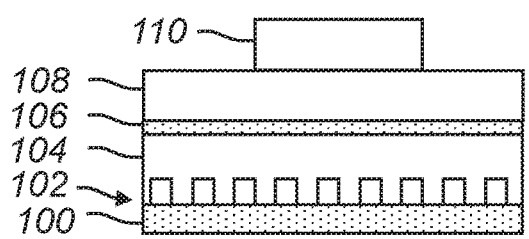 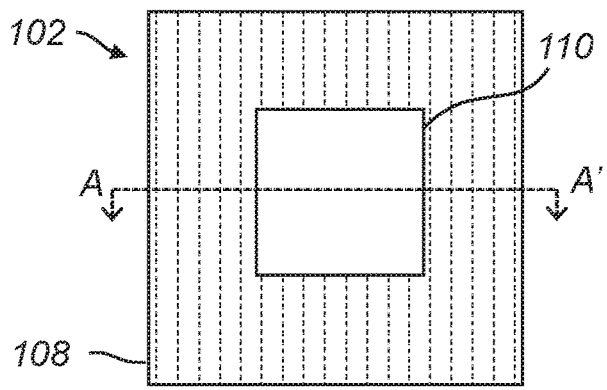
Fig. 1A
Fig. 1B
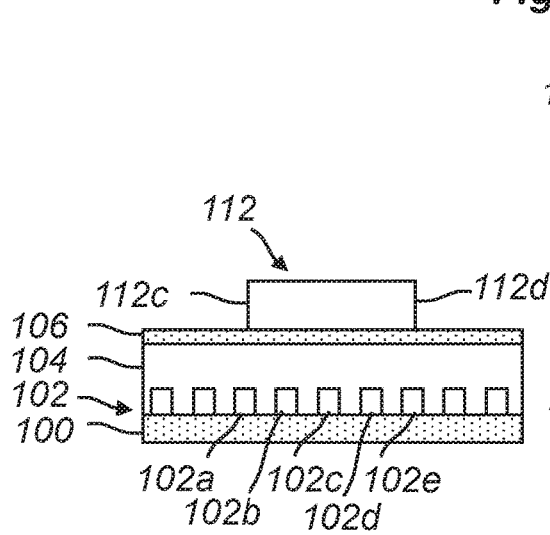 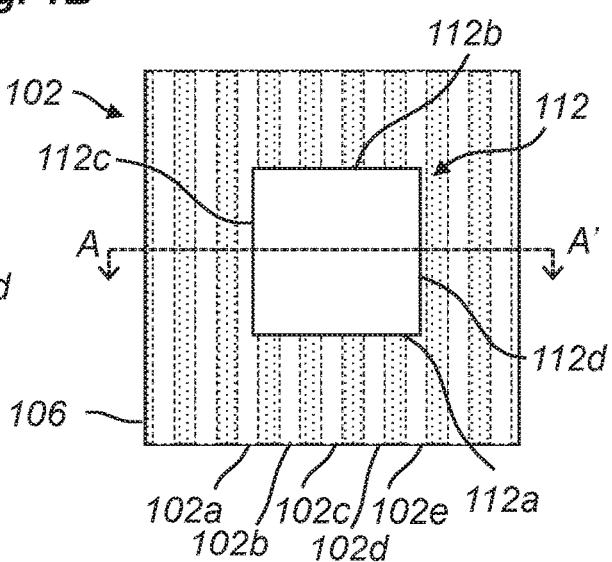
Fig. 1C

PATTERNING A TARGET LAYER

CROSS-REFERENCE TO RELATED APPLICATIONS

The present application is a non-provisional patent application claiming priority to European Patent Application No. EP 17177328.6, filed on Jun. 22, 2017, the contents of which are hereby incorporated by reference.

FIELD OF THE DISCLOSURE

The present disclosure relates to a patterning method.

BACKGROUND

Modern circuit fabrication typically involves forming of patterns in a layer. Frequently occurring examples include forming a pattern in a dielectric layer for the purpose of defining an electrical interconnection structure, or forming a pattern in a semiconductor layer for the purpose of defining semiconductor structures.

Techniques for patterning a layer include lithography and etching processes ("litho-etch"). A photoresist may be patterned by lithography and the photoresist pattern may thereafter be transferred into an underlying layer by etching. Other patterning techniques include multiple patterning techniques like (litho-etch)$^x$, or pitch splitting techniques such as self-aligned double patterning (SADP) or quadruple patterning (SAQP). Such techniques enable forming of patterns with sub-lithographic critical dimensions.

In many instances, it is desirable to make interrupted or discontinuous line patterns. "Block" or "cut" techniques typically involve forming of a block in a mask pattern, or cutting away a portion of a mask pattern, at a position where an interruption is to be formed. However, certain techniques may be challenging to down-scale to sub-lithographic dimensions. These techniques may also provide limited control over the critical dimensions of the interruption. As pattern densities are ever increasing, this is becoming a growing issue.

SUMMARY

Some embodiments of this disclosure may provide an improved method for patterning a target layer.

According to a first aspect of the present disclosure a method is provided for patterning a target layer, the method comprising: (i) forming above the target layer a line mask and a mandrel mask, wherein forming the line mask comprises forming parallel material lines extending in a longitudinal direction, wherein forming the mandrel mask comprises forming a mandrel mask having sidewalls including at least a first sidewall extending transverse to a plurality of the material lines; (ii) forming on the sidewalls of the mandrel mask a sidewall spacer including a first sidewall spacer portion extending along the first sidewall; (iii) partially removing the sidewall spacer such that a remainder of the sidewall spacer comprises at least a part of the first sidewall spacer portion; and (iv) subsequent to removing the mandrel mask, transferring into the target layer a pattern defined by the line mask and the remainder of the sidewall spacer.

By the method, the target layer may be patterned to include trenches, at least one of which is interrupted to form a discontinuous trench.

More specifically, by transferring the pattern into the target layer, trenches may be formed in the target layer, wherein trenches across which the at least a part of the first sidewall spacer portion extends are divided into trench sections (i.e. along the longitudinal direction).

By partially removing the sidewall spacer, a transversely extending "block" mask may be formed by the remainder of the sidewall spacer. The remainder of the sidewall spacer forms a mask defining positions for interruptions of trenches formed in the target layer during the pattern transfer.

According to the method, the critical dimension of the interruption (i.e. the dimension or "length" of the interruption in the longitudinal direction or distance tip-to-tip of the trench sections) is defined by the width or thickness of the first sidewall spacer portion. Sidewall spacers may be formed as comparably thin structures, with a high degree of control over the width dimension. This in turn enables forming of interruptions with correspondingly small dimensions and a corresponding degree of control.

The sidewall spacer, in combination with the mandrel mask being extended such that the first sidewalls extends transverse to a plurality of the material lines, may be formed with a comparably uniform thickness on a smooth and/or straight sidewall surface portion. Hence, a variability of the critical dimension of a single interruption, as well as a variability of the critical dimension between different interruptions, may be reduced. This may be referred to as a reduced local and global tip-to-tip variability, respectively.

As may be further understood from the following, the method further provides flexibility in the sense that it is compatible with both "block first" and "block last" approaches, as well as with mandrel masks being formed as positive or negative mask features.

"Patterning" of a target layer means the forming or definition of a pattern above the target layer, and a transfer of the pattern into the target layer.

The transfer of the pattern into the target layer may include etching the target layer using the line mask and the at least a part of the first sidewall spacer portion as a combined etch mask.

"Target layer" means any material layer in which a pattern is to be formed. The target layer may refer to the final layer in which the desired pattern is to be formed. However, in many processes the final pattern is, rather than being directly transferred into a final layer (such as a dielectric layer of a metallization level), formed or memorized in a "patterning" or "memorizing" layer, for instance in the form of a hard mask layer. The disclosed method is applicable to patterning any type of target layers, including such memorizing layers.

By a second feature such as a layer, a mask or other element, being formed "above" a first feature such as a layer, a mask or other element, means that the second feature is formed above the first feature along (or as seen) in a stacking direction of the features forming part of the overall structure. This direction may equivalently be defined as a normal direction to (a main surface of) the target layer, or a normal direction to a substrate supporting the features or layers. The stacking or normal direction may also be referred to as a "vertical" direction. A "horizontal" direction may be used to refer to a direction parallel to a main plane of extension, or a main surface, of the target layer or of the substrate.

By a second feature such as a layer, a level or other element, being formed "on" a first feature such as a layer, a level or other element, means that the second feature is formed directly on the first feature, i.e. in abutment with the first feature, or with one or more layers intermediate the second and the first feature, i.e. not in direct contact with the first feature.

The line mask may include a plurality of parallel material lines. The material lines may be regularly spaced material lines. The material lines may be spaced apart such that longitudinal gaps are formed between the lines. The gaps may present a regular width and spacing. The lines may, at least along a portion thereof, extend in a straight line and present a uniform width or substantially uniform width. This applies correspondingly to the gaps between the lines.

"Mandrel mask" means a mask feature formed to present sidewalls having at least a first sidewall. The sidewalls may be outer sidewalls of the mandrel mask, i.e. sidewalls facing in an outward direction with respect to the mandrel mask (when the mandrel mask is formed as a "positive" mask feature). The sidewalls may be inner sidewalls of the mandrel mask, i.e. sidewalls facing in an inward direction with respect to the mandrel mask (when the mandrel mask is a "negative" mask including an opening and the sidewalls are sidewalls of the opening).

The line mask and the mandrel mask may refer to masks formed at different levels above the target layer. As will be further described below the mandrel mask may be formed either above or below the line mask.

The first sidewall extends in a direction transverse to a plurality of material lines of the line mask. The extension of the first sidewall here refers to a length dimension of the first sidewall, i.e. the extension of the first sidewall in a horizontal direction. By a direction "transverse" to the material lines, is hereby meant transverse to the longitudinal direction of the material lines. The extension of the first sidewall may be perpendicular to the longitudinal direction of the material lines. However, the first sidewall may more generally extend at an angle to the longitudinal direction of the material lines.

A length dimension of the first sidewall may correspond to a distance between more than two consecutive material lines of the line mask.

"Sidewall spacer", or equivalently "sidewall spacer layer," means a material layer covering the sidewalls of the mandrel mask.

Forming the sidewall spacer may include covering the mandrel mask with a spacer material layer, and etching the spacer material layer anisotropically such that portions of the spacer material layer remain on the sidewalls of the mandrel mask. Thereby, the remaining portions may form the sidewall spacer.

An "anisotropic" etch means an etch process etching preferentially, i.e. having an etch rate which is greater, along a main direction. To form the sidewall spacer, the etching may be performed mainly (i.e. the direction of greater etch rate may be oriented) along a vertical direction.

The spacer material layer may be formed as a conformal layer.

In the present disclosure, processes are disclosed including etching of a layer, a structure, a mask or other feature of a material "A", while preserving another layer, a structure, a mask or other feature of a material "B" (i.e. etching the feature of material A "selectively" to the feature of material B). For instance, the feature of material B may act as an etch mask during etching of the feature of material A. A selective etching means that a feature of material A arranged adjacent to a feature of material B may be removed while preserving the feature of material B. This may be achieved by selecting material A and material B as a combination of materials presenting different etch rates in a given etch process. The preservation of the feature of material B following the etch process may be complete (in the sense that the feature of material B not is affected appreciably during the etch process) or at least partial (in the sense that the feature of material B remains at least to the extent that it may serve its intended function during subsequent process steps). A ratio of an etch rate of the material "A" compared to an etch rate of the material "B" (i.e. an etch contrast) may be 10:1 or higher, 40:1 or higher, or even 100:1 or higher. The amount of etch contrast needed may vary depending on the relative thicknesses of the features.

According to one embodiment, the act of partially removing the sidewall spacer includes partially removing the first sidewall spacer portion such that the remainder of the sidewall spacer includes a remaining part of the first sidewall spacer portion. This provides a degree of flexibility in that only a part of the first sidewall spacer portion needs to be used during the pattern transfer. The mandrel mask may hence be formed with an extended lateral dimension to provide an as smooth and/or straight first sidewall surface as possible with less regard to how many consecutive trenches finally are to be formed as interrupted trenches.

The act of partially removing the sidewall spacer may include removing at least a first and a second peripheral part of the first sidewall spacer portion. This allows the peripheral parts or end parts of the first sidewall spacer portion, which due to their location closer to edges of the mandrel mask may present a slightly rounded or bent shape, to be removed. Hence, the remainder of the sidewall spacer may include a remaining part of the first sidewall spacer portion.

A remaining part of the first sidewall spacer portion may have a first end and a second end (and extend between the same), wherein the first end is aligned with a first material line of the line mask and the second end is aligned with a second material line of the line mask. Hence, it may be ensured that no trenches are only "partially" blocked of the remaining part of the first sidewall spacer portion, for instance ends of the first sidewall spacer portion protruding slightly beyond a sidewall of a respective material line.

The transfer of the pattern into the target layer may include etching the target layer using the line mask and the at least a part of the first sidewall spacer portion, or the remaining part of the first sidewall spacer portion, as an etch mask. The line mask and at least a (remaining) part of the first sidewall spacer portion may accordingly act as a combined etch mask with respect to the target layer, during the pattern transfer.

According to one embodiment, the sidewalls of the mandrel mask further includes a second sidewall extending transverse to a plurality of the material lines, wherein the sidewall spacer further includes a second sidewall spacer portion extending along the second sidewall. The act of partially removing the sidewall spacer may accordingly include partially removing the sidewall spacer such that the remainder of the sidewall spacer further includes at least a part of the second sidewall spacer portion. Hence, the mandrel mask may be used to support both a first and a second sidewall spacer portion which may be used (at least in part) to define interrupted trenches at two different positions along the longitudinal direction of the line mask. The act of transferring into the target layer the pattern defined by the line mask and the remainder of the sidewall spacer may accordingly include transferring the pattern defined by the line mask, the at least part of the first sidewall spacer portion and the at least a part of the second sidewall spacer portion.

The second sidewall of the mandrel mask may extend transverse to a same plurality of material lines as the first sidewall of the mandrel mask.

The extension of the second sidewall may be perpendicular to the longitudinal direction of the material lines. However, the second sidewall may more generally extend at an angle to the longitudinal direction of the material lines. The second sidewall may extend in parallel to the first sidewall.

A length dimension of the second sidewall may correspond to a distance between more than two consecutive material lines of the line mask.

A length dimension of the second sidewall may also correspond to a length dimension of the first sidewall.

According to one embodiment, the act of partially removing the sidewall spacer includes partially removing the second sidewall spacer portion such that the remainder of the sidewall spacer includes a remaining part of the second sidewall spacer portion. This provides a degree of flexibility in that only a part of the second sidewall spacer portion needs to be used during the pattern transfer. The mandrel mask may hence be formed with an extended lateral dimension to provide an as smooth and/or straight second sidewall surface as possible with less regard to how many consecutive trenches finally are to be formed as interrupted trenches The remaining part of the second sidewall spacer portion may, but need not, be coextensive with a remaining part of the first sidewall spacer portion.

The act of partially removing the sidewall spacer may include removing at least a first and a second peripheral part of the second sidewall spacer portion. This allows the peripheral parts or end parts of the second sidewall spacer portion, which due to their location closer to edges of the mandrel mask may present a slightly rounded or bent shape, to be removed prior to the pattern transfer. Hence, the remainder of the sidewall spacer may include a respective remaining part of the first and the second sidewall spacer portion.

A remaining part of the second sidewall spacer portion may have a first end and a second end (and extend between the same), wherein the first end is aligned with a third material line of the line mask and the second end is aligned with a fourth material line of the line mask. Hence, it may be ensured that no trenches are only "partially" blocked of the remaining part of the second sidewall spacer portion, for instance by ends of the second sidewall spacer portion protruding slightly beyond a sidewall of a respective material line.

The transfer of the pattern into the target layer may include etching the target layer using the line mask, at least a (remaining) part of the first sidewall spacer portion and at least a (remaining) part of the second sidewall spacer portion as an etch mask. The line mask, at least a (remaining) part of the first sidewall spacer portion and at least a (remaining) part of the second sidewall spacer portion may accordingly act as a combined etch mask with respect to the target layer, during the pattern transfer.

According to one embodiment, the sidewalls of the mandrel mask further includes third and fourth sidewalls extending along the material lines, and the sidewall spacer further includes a third sidewall spacer portion extending along the third sidewall and a fourth sidewall spacer portion extending along the fourth sidewall, wherein the act of partially removing the sidewall spacer includes removing the third and fourth sidewall spacer portions. By removing the third and fourth sidewall spacer portions, only transversally extending segments of the sidewall spacer will remain during the pattern transfer. The third and fourth sidewalls may connect the first and second sidewalls. The third and fourth sidewall spacer portions may extend along the longitudinal direction of the material lines. The third and fourth sidewall spacer portions may extend in parallel to each other.

According to one embodiment the act of partially removing the sidewall spacer includes:
   forming a cut mask layer above the sidewall spacer;
   forming at least one opening in the cut mask layer to expose parts of the sidewall spacer; and
   removing the exposed parts of the sidewall spacer by etching through the at least one opening.

The (opened) cut mask layer may hence act as an etch mask during the etching of the exposed parts of the sidewall spacer. This amounts to a convenient manner, process-wise, of obtaining a remainder of the sidewall spacer including (only) transversely extending sidewall spacer portions.

According to one embodiment, the mandrel mask is formed subsequent to and above the line mask. This embodiment enables a "block last" approach where the positions of the trench interruptions may be defined after forming of the line mask. The first sidewall (and optionally also the second sidewall) of the mandrel mask may hence be formed to extend across a plurality of the material lines of the line mask. Correspondingly, the at least a part of the first sidewall spacer portion (and optionally the at least a part of the second sidewall spacer portion) may extend across the plurality of material lines, or a (respective) subset of the plurality of material lines.

According to an alternative embodiment, the line mask is formed subsequent to and above the mandrel mask. This embodiment enables a "block first" approach where the positions of the trench interruptions may be defined prior to forming of the line mask.

According to a second aspect of the present disclosure, there is provided a method for patterning a target layer, the method comprising: (i) forming above the target layer a line mask and a mandrel mask and a buffer layer, wherein forming the line mask includes forming parallel material lines extending in a longitudinal direction, wherein forming the mandrel mask includes forming a mandrel mask above the buffer layer, the mandrel mask having sidewalls including at least a first sidewall extending transverse to a plurality of the material lines; (ii) forming on the sidewalls of the mandrel mask a sidewall spacer including a first sidewall spacer portion extending along the first sidewall; (iii) subsequent to removing the mandrel mask, transferring a pattern defined by the sidewall spacer into the buffer layer to form a patterned buffer layer; (iv) partially removing the patterned buffer layer such that a remainder of the patterned buffer layer includes at least one transversely extending part; and (v) transferring into the target layer a pattern defined by the line mask and the at least one transversely extending part.

The second method aspect amounts to an alternative method for patterning a target layer providing the same or corresponding advantages as discussed above in connection with the first aspect.

The transfer of a pattern defined by the sidewall spacer into the buffer layer may include etching the buffer layer using the sidewall spacer as an etch mask.

The transfer into the target layer of a pattern defined by the line mask and the at least one transversely extending part may include etching the target layer using the line mask and the at least one transversely extending part as an etch mask.

The embodiments and discussion of the first aspect relating to the partial removal of the sidewall spacer applies correspondingly to the partial removal of the patterned buffer layer. Hence, the partial removal may for instance include removal of peripheral parts of the at least one transversely extending part.

The embodiments and discussion of the first aspect relating to the second, the third and the fourth sidewall spacer portions applies correspondingly to the patterned buffer layer. Hence, the patterned buffer layer may include one or more of: a first transversely extending part, a second transversely extending part, a third transversely extending part and a fourth transversely extending part (corresponding to the first, second, third and fourth sidewall spacer portions, respectively).

BRIEF DESCRIPTION OF THE FIGURES

The above, as well as additional, features will be better understood through the following illustrative and non-limiting detailed description of example embodiments, with reference to the appended drawings.

FIGS. 1A-K schematically illustrate a method for patterning a target layer, according to an example embodiment.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

A method for patterning a target layer will now be described with reference to FIGS. 1A-K.

The method comprises forming a line mask 102 and a mandrel mask 112 above a target layer 100. The line mask 102 is formed to include parallel material lines extending in a longitudinal direction (FIG. 1A). The mandrel mask 112 is formed with sidewalls 112a-d including at least a first sidewall 112a extending transverse to a plurality of the material lines of the line mask 102 (FIG. 1C).

Figure 1D:
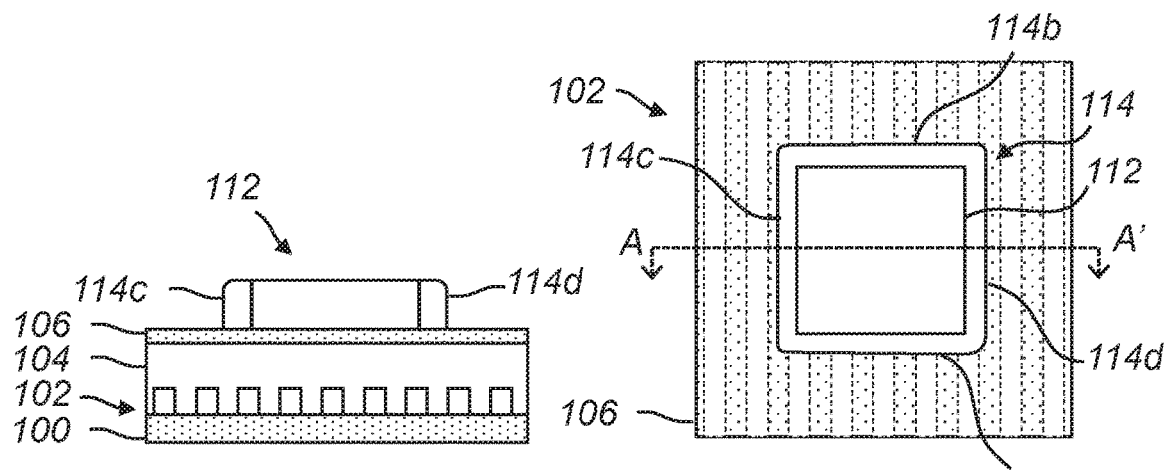
Figure 1E:
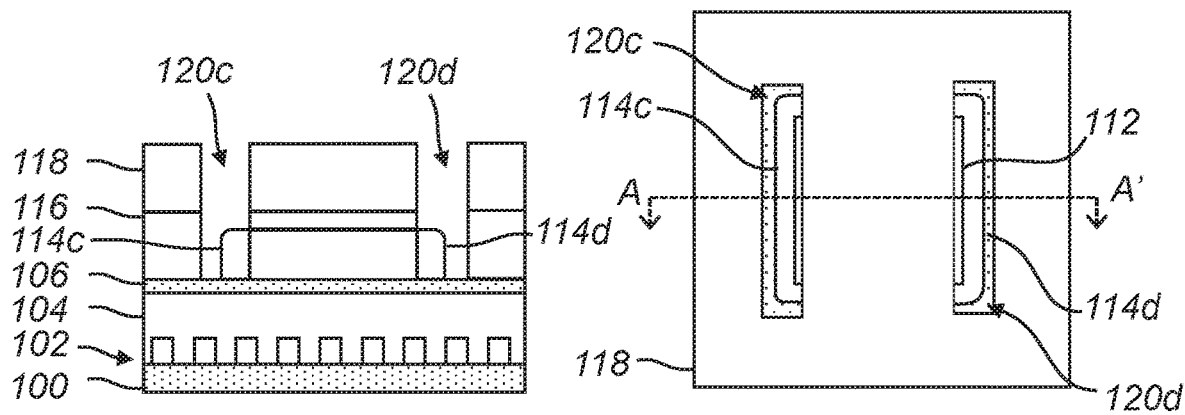
Figure 1F:
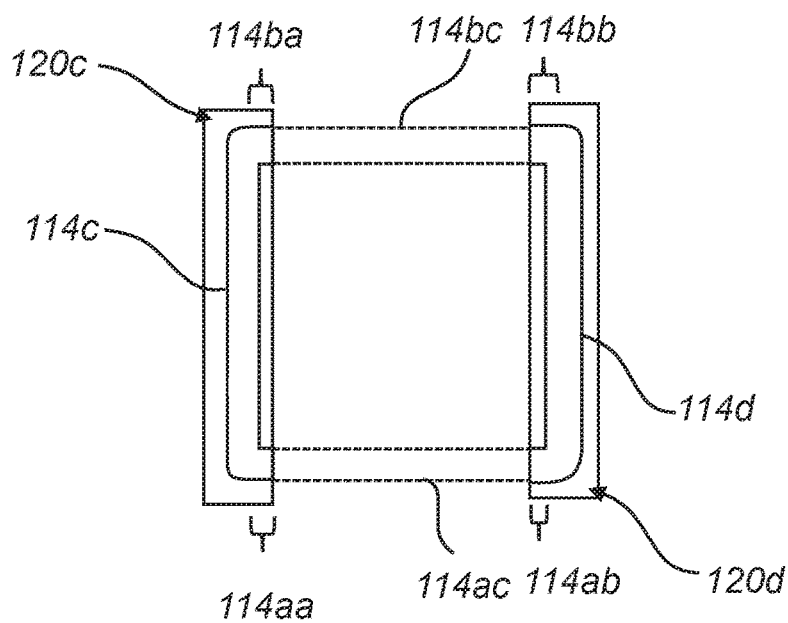
Figure 1G:
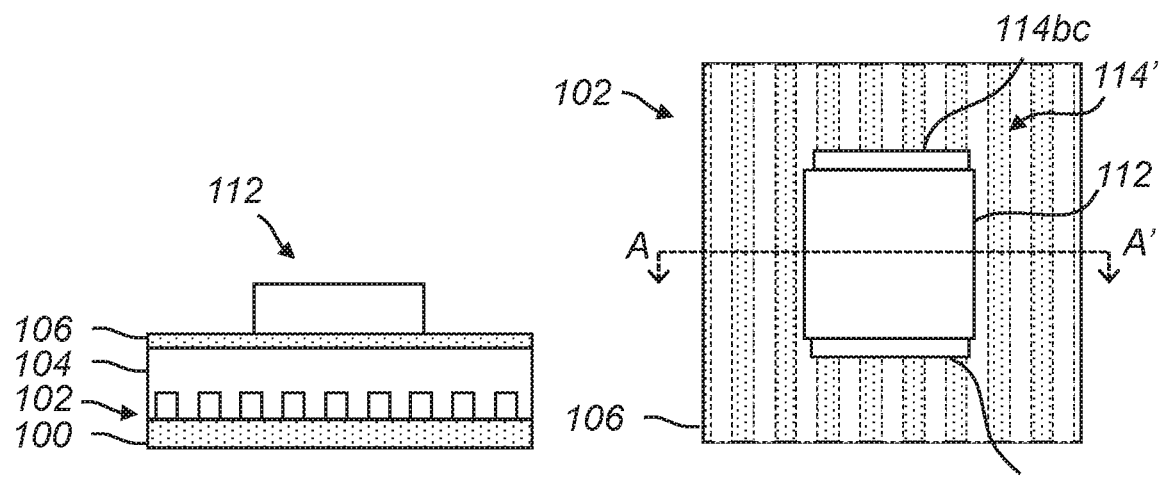

The method further comprises forming a sidewall spacer 114 on the sidewalls 112a-d of the mandrel mask 112. The sidewall spacer 114 includes a first sidewall spacer portion 114a extending along the first sidewall 112a of the mandrel mask 112 (FIG. 1D). The sidewall spacer 114 is then partially removed such that a remainder 114' of the sidewall spacer 114 is formed, the remainder 114' including at least a part of the first sidewall spacer portion 114a (FIG. 1E-G). Subsequent to removing the mandrel mask 112, a pattern is transferred into the target layer 100, the pattern being defined by the line mask 102 and the remainder 114' of the sidewall spacer 114 (FIG. 1J).

The target layer 100 which the following description will refer to may be a hard mask layer. Subsequent to patterning of the hard mask layer, the hard mask layer may accordingly be used as an etch mask to form a corresponding pattern in an underlying layer. The method may for instance be used for defining in the target layer 100 a pattern for conductive lines of a metallization level of a semiconductor device. The target layer 100 may be formed above a dielectric layer of the metallization level. The pattern in the target layer 100 may be transferred into the dielectric layer by etching. Thereby trenches, including a number of interrupted trenches, may be formed in the dielectric layer. By filling the trenches with a conductive material, a conductive pattern may be formed in the dielectric layer, the pattern including conductive lines wherein a number of the lines are interrupted along their longitudinal direction.

Although being useful in the context of forming a conductive pattern in a dielectric layer, the method has a general applicability for forming trenches, including interrupted trenches, in a target layer. The merits of the method become increasingly pronounced for smaller technology nodes, and may enable forming of patterns with the small critical dimensions which are attainable with for instance extreme ultraviolet lithography (EUVL).

In FIG. 1A and the subsequent figures, unless noted otherwise, the right hand side schematically illustrates a top view of a portion of the structure at various stages of the method. The left hand side schematically illustrates a cross-sectional side-view, taken along the line indicated in the corresponding top view (the lines AA' or BB').

FIG. 1A also includes horizontal direction Y, parallel to the longitudinal direction of the lines 102, horizontal direction X, perpendicular to the lines 102, and vertical direction Z, normal to the main surface of the target layer 100.

The structure may extend laterally or horizontally beyond the illustrated portion. For instance, the material lines 102 may be elongated to extend beyond the boundaries of the schematic drawings. Hence, although being referred to as "lines" 102 any reference to a line 102 may be understood as reference to a straight-line part of a possibly longer line.

It is noted that the relative dimensions of the shown elements, in particular the relative thickness of the layers, is merely schematic and may, for the purpose of illustrational clarity, differ from a physical structure.

With reference to FIG. 1A there is shown the target layer 100. The target layer 100 may be formed on another layer (not-shown), for instance a dielectric layer such as a silicon oxide layer, such as $SiO_2$, or another low-K dielectric material, or a semiconductor layer. The target layer 100 may be formed by TiN, $TiO_x$, $HfO_x$, $ZrO_x$ or some other hard mask material. The target layer 100 may however also, depending on the circumstances and the material of the layer below the target layer 100, be formed of non-metal based materials such as SiCN, $SiO_x$, a-C or a-Si. The target layer 100 may be formed using any conventional deposition process which is suitable for the particular material of the target layer 100. Examples include atomic layer deposition (ALD), chemical vapor deposition (CVD), physical vapor deposition (PVD) or spin-on-deposition.

The line mask 102 is formed on the target layer 100. The line mask 102 includes a plurality of parallel material lines extending along the longitudinal direction Y. For simplicity, the reference numeral 102 may in the following be used interchangeably to refer to both the line mask 102 and the lines of the line mask 102. The lines 102 may as shown be regularly spaced apart along the transverse direction X such that longitudinal gaps are formed between the lines 102. The line mask 102 may also be referred to as a grating layer 102.

The material lines 102 may be formed of any of the materials mentioned in connection with the target layer 100. However, the materials of the target layer 100 and the lines 102 should be selected to as different materials, to allow etching of the target layer 100 using the material lines 102 as an etch mask as will be further described below.

The line mask 102 may be formed by forming a line material layer (not shown) on the target layer 100. The line material layer may be deposited using a deposition process suitable for the selected material. The plurality of material lines 102 may then be formed by patterning the line material layer. The lines 102 may be formed in a single lithography-etching process. Lines 102 with a line width and a line spacing corresponding to the resolution of the lithographic process may thereby be formed. The lines 102 may also be formed in a multiple patterning process. Lines 102 with a line width and a line spacing with sub-lithographic dimensions may thereby be formed. Examples of multiple-patterning techniques include (litho-etch)$^x$, or pitch splitting techniques such as self-aligned double patterning (SADP) or quadruple patterning (SAQP).

In FIG. 1B, a planarization layer 104 has been formed to cover the line mask 102. To facilitate understanding, the positions of the lines 102 (now covered by the above layer stack) are indicated by dashed lines in the top-view. The planarization layer 104 may be formed by spin-coating. The planarization layer 104 may for instance be formed by a spin-on-carbon-material (SOC-material), or some other organic- or polymer-based material. However, other materials, such as an oxide-material, are also possible. In any case, the materials of the lines 102 and the planarization layer 104 should be selected to as different materials, to allow selective etching of the planarization layer 104 with respect to the material lines 102.

A buffer layer 106 is formed on the planarization layer 104. The buffer layer 106 may act as a buffer layer with respect to the various processing which is to be performed above the buffer layer 106. Among others, the buffer layer 106 may act as an etch stop layer with respect to the etching of the mandrel mask layer 108 and the sidewall spacer 114, which will be described below. The buffer layer 106 may be formed of any of the materials mentioned in connection with the target layer 100, for instance a hard mask material.

Although not shown, a capping layer, for instance of a (possibly) low temperature oxide, may be formed between the planarization layer 104 and the buffer layer 106.

A mandrel mask layer 108 is formed on the buffer layer 106. The mandrel mask layer 108 forms a layer in which the mandrel mask 112 is to be formed. The mandrel mask layer 108 may be formed by an a-C material, for instance an advanced patterning film (APF) obtainable from Applied Materials®. However, the mandrel mask layer 108 may also be formed of other materials such as SOC or any of the afore-mentioned hard mask materials.

A photo resist layer 110 is formed on the mandrel mask layer 108. The photo resist layer 110 may be patterned, using lithography, to define a photo resist mask with lateral dimensions corresponding to the desired lateral dimensions of the mandrel mask 112.

Although not shown, one or more intermediate layers, for instance a spin-on-glass layer, a SiOC layer or some other Si-including layer, may be formed between the mandrel mask layer 108 and the photo resist layer 110, to facilitate the subsequent pattern transfer into the mandrel mask layer 108.

In FIG. 1C, the mandrel mask 112 has been formed above the line mask 102. The mandrel mask 112 is formed of remaining portions of the mandrel mask layer 108. The mandrel mask 112 has been formed by transferring the pattern in the photo resist layer 110 into the mandrel mask layer 108. The mandrel mask layer 108 may be etched while using the patterned photo resist layer 110 as an etch mask. A dry etching process may be used, for instance including $N_2/H_2$ or $O_2$-based etching chemistries.

The mandrel mask 112 includes a set of outwardly facing sidewalls. The mandrel mask 112 includes a first sidewall 112a extending perpendicular to the lines 102. The mandrel mask 108 includes a second sidewall 112b extending perpendicular to the lines 102. The first sidewall 112a and the second sidewall 112b form a first pair of mutually opposite and parallel extending sidewalls of the mandrel mask 112. The mandrel mask 112 includes a third sidewall 112c and a fourth sidewall 112d extending along the lines 102. The third sidewall 112c and the fourth sidewall 112d connect the first sidewall 112a and the second sidewall 112b. The third sidewall 112c and the fourth sidewall 112d form a second pair of mutually opposite and parallel extending sidewalls of the mandrel mask 112.

As shown in FIG. 1C, a length dimension (i.e. along the direction X) of the first sidewall 112a (as well as of the second sidewall 112b) is such that the first sidewall 112a spans a distance from a line 102a to a line 102e. Accordingly, the length dimension of the first sidewall 112a corresponds to a distance between more than two consecutive material lines of the line mask 102. In FIG. 1C, the first sidewall 112a spans a distance from a first line 102a to a fifth line 102e. However, this merely represents one example and the mandrel mask 112 may be formed to span a distance of fewer or more lines, however at least two consecutive lines 102.

In FIG. 1D, a sidewall spacer 114 has been formed on the sidewalls 112a-d of the mandrel mask 112. The sidewall spacer may be formed by covering the mandrel mask 112 and the buffer layer 106 with a spacer material layer (not shown). The spacer material layer may be formed by a nitride material, such as SiN, an oxide material, such as $SiO_2$, or a metal oxide, such as $TiO_x$. The spacer material layer is deposited as a conformal layer, for instance by ALD or PEALD. The spacer material layer may subsequently be etched anisotropically along the vertical direction Z such that portions of the spacer material layer is removed from horizontal surfaces and remain on the sidewalls 112a-d of the mandrel mask 112 to form the sidewall spacer 114.

As shown in FIG. 1C, the sidewall spacer 114 includes a set of sidewall spacer portions. The sidewall spacer 114 includes a first sidewall spacer portion 114a formed on and extending along the first sidewall 112a. The sidewall spacer 114 includes a second sidewall spacer portion 114b formed on and extending along the second sidewall 112b. The sidewall spacer 114 includes a third sidewall spacer portion 114c formed on and extending along the third sidewall 112c. The sidewall spacer 114 includes a fourth sidewall spacer portion 114d formed on and extending along the fourth sidewall 112d. The first through fourth sidewall spacer portions 114a-d together form or constitute the sidewall spacer 114.

The first sidewall spacer portion 114a extends in the direction X, perpendicular to the lines 102. The second sidewall spacer portion 114b extends in the direction X, perpendicular to the lines 102. The third and fourth sidewall spacer portions 114c, 114d connects the first and second sidewall spacer portions 114a, 114b. The third and fourth sidewall spacer portions 114c, 114d extend in the longitudinal direction Y, along the material lines 102.

In FIG. 1E, a cut mask layer 116 including openings 120c, 120d has been formed above the sidewall spacer 114. The cut mask layer 116 may be formed to cover the mandrel mask 112 and the sidewall spacer 114. The cut mask layer 116 may be formed by any material allowing formation of openings 120c, 120d with needed critical dimensions and which may be used as an etch mask during the partial removal of the sidewall spacer 114. The cut mask layer 116 may for instance be formed by a SOC-layer, possibly supplemented with an upper spin-on-glass layer.

A photo resist layer 118 is formed on the cut mask layer 116. The photo resist layer 118 may be patterned, using lithography, to define a photo resist mask with openings at the positions where the openings 120c, 120d are to be formed. The openings in the photo resist layer 118 may subsequently be transferred into the cut mask layer 116 by etching.

As shown in FIG. 1E, the opening 120c exposes the third sidewall spacer portion 112c. The opening 120d exposes the fourth sidewall spacer portion 112d. This is further clarified in FIG. 1F showing an enlarged top view of the sidewall spacer 114 and the openings 120c, 120d. The portions of the sidewall spacer 114 covered by the cut mask layer 116 are shown with dashed lines.

The openings 120c, 120d may as seen be formed to expose portions of also the first and the second sidewall spacer portions 114a, 114b. More specifically, the opening 120c may expose a first peripheral part 114aa of the first sidewall spacer portion 114a and a first peripheral part 114ba of the second sidewall spacer portion 114b. The opening 120d may expose a second peripheral part 114ab of the first sidewall spacer portion 114a and a second peripheral part 114bb of the second sidewall spacer portion 114b. Meanwhile, the cut mask layer 116 may cover a respective intermediate portion 114ac and 114bc extending between the respective first and second peripheral parts 114aa, 114ab/114ba, 114bb.

The first peripheral part 114aa here refers to a part of the first sidewall spacer portion 114a which extends to connect to the third sidewall spacer portion 114c. The second peripheral part 114ab refers to a part of the first sidewall spacer portion 114a which extends to connect to the fourth sidewall spacer portion 114d. The first peripheral part 114ba refers to a part of the second sidewall spacer portion 114b which extends to connect to the third sidewall spacer portion 114c. The second peripheral part 114bb refers to a part of the second sidewall spacer portion 114b which extends to connect to the fourth sidewall spacer portion 114d. Each of the peripheral parts is formed at a respective corner of the mandrel mask 112.

In FIG. 1G the sidewall spacer 114 has been partially removed. The sidewall spacer 114 may be partially removed by etching the exposed portions of the sidewall spacer 114 through the openings 120c, 120d. A dry etching chemistry may be used. For instance, a nitride- or oxide-material sidewall spacer may be etched with a fluorine-based chemistry. A metal-oxide based sidewall spacer may be etched using a chlorine-based chemistry.

FIG. 1G accordingly shows the remainder 114' of the sidewall spacer 114 on the first and second sidewalls 112a, 112b of the mandrel mask 112. The remainder 114' includes a remaining part 114ac of the first sidewall spacer portion 114a. The remainder 114' further includes a remaining part 114bc of the second sidewall spacer portion 114b. The sidewall spacer 114 has hence been partially removed in that the third sidewall spacer portion 114c, the fourth sidewall spacer portion 114d and the peripheral parts 114aa, 114ab, 114ba, 114bb of the first and second sidewall spacer portions 114a, 114b have been removed.

Figure 1H:
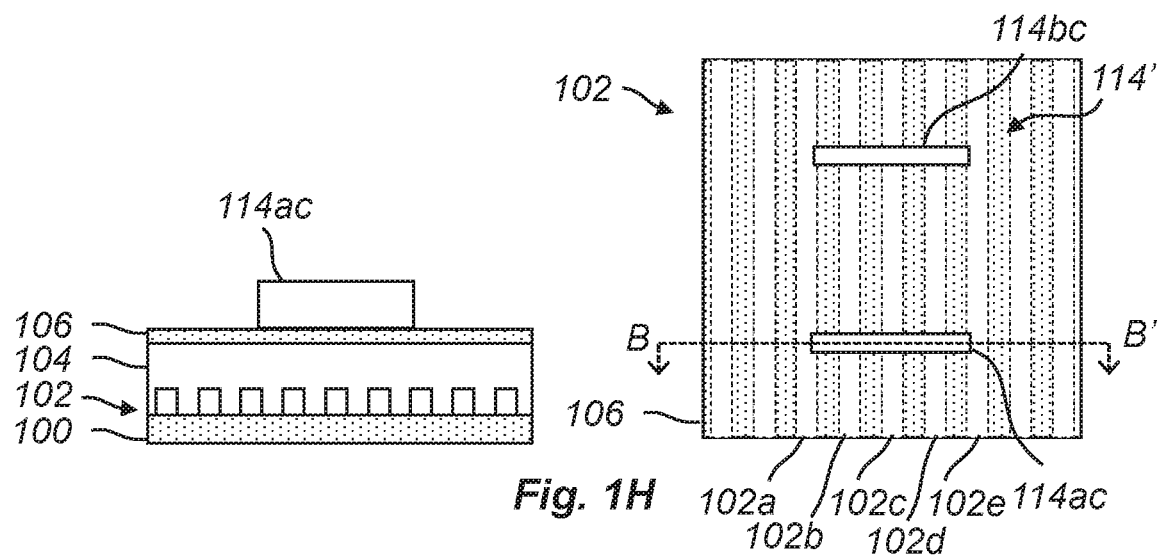

In FIG. 1H, the mandrel mask 112 has been removed. Accordingly, the respective remaining parts 114ac, 114bc of the first and second sidewall spacer portions 114a, 114b remain on the buffer layer 106. The mandrel mask 112 may be removed using a dry etch adapted to selectively remove the mandrel mask 112 with respect to the remaining parts 114ac, 114bc of the first and second sidewall spacer portions 114a, 114b. A carbon-based mandrel mask 112 may be etched using for instance $N_2/H_2$- or $O_2$-based chemistries. As may be seen in FIG. 1G the remaining part 114ac has a first end and a second end, the first end being aligned with or overlapping a first material line 102a and the second end being aligned or overlapping with a second material line 102e. This applies correspondingly to the remaining part 114bc.

Figure 1I:
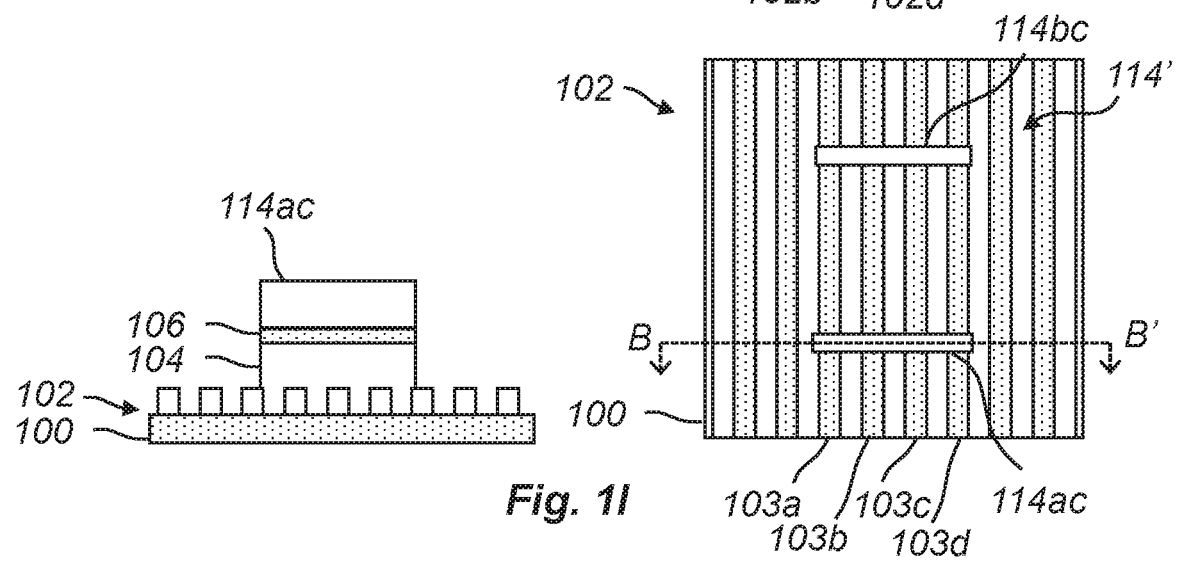
Figure 1J:
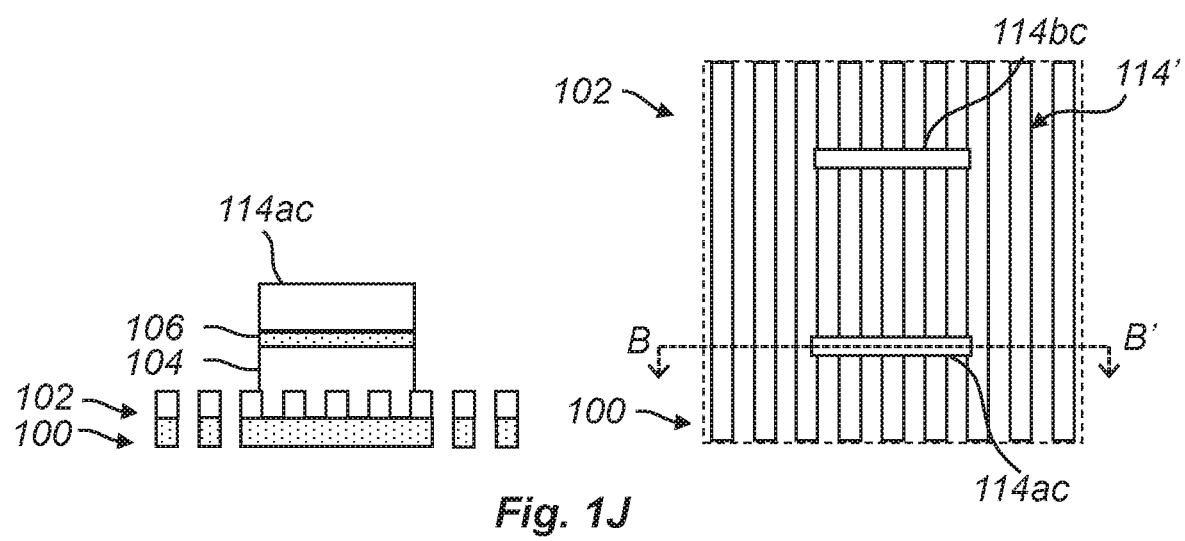

In FIG. 1I, a pattern transfer into the target layer 100 has been initiated by patterning the buffer layer 106 and the planarization layer 104 by etching using the respective remaining parts 114ac, 114bc of the first and second sidewall spacer portions 114a, 114b as an etch mask. Accordingly, the line mask 102 is exposed with transverse "block masks", defined by the respective remaining parts 114ac, 114bc, extending across a subset of the lines 102. As may be seen, the remaining parts 114ac, 114bc extends across the gaps 103a-e between the lines 102. The gaps 103a-e are hence interrupted along the longitudinal direction Y, at positions defined by, i.e. underneath, the remaining parts 114ac, 114bc. As may be appreciated, the number of interrupted gaps may be controlled by the length dimension of the remaining parts 114ac, 114bc.

In FIG. 1J, a pattern defined jointly by the respective remaining parts 114ac, 114bc of the first and second sidewall spacer portions 114a, 114b and the line mask 102 has been finally transferred into the target layer 100. The target layer 100 has been etched using the line mask 102 and the remainder 114' of the sidewall spacer 114, including the remaining parts 114ac, 114bc, as an etch mask. Although not shown, the remainder 114' of the sidewall spacer may be consumed, at least partially, during the initial pattern transfer steps (for instance during etching of the planarization layer 104) and/or during the final pattern transfer (for instance during etching of the target layer 100), wherein the patterned buffer layer 106 may be used as a transversely extending etch mask during the etching of the target layer 100. A hard mask material target layer 100 of for instance TiN may be etched using for instance chlorine-based chemistries. A dielectric material target layer 100 may be etched using for instance fluorine-based chemistries.

Figure 1K:
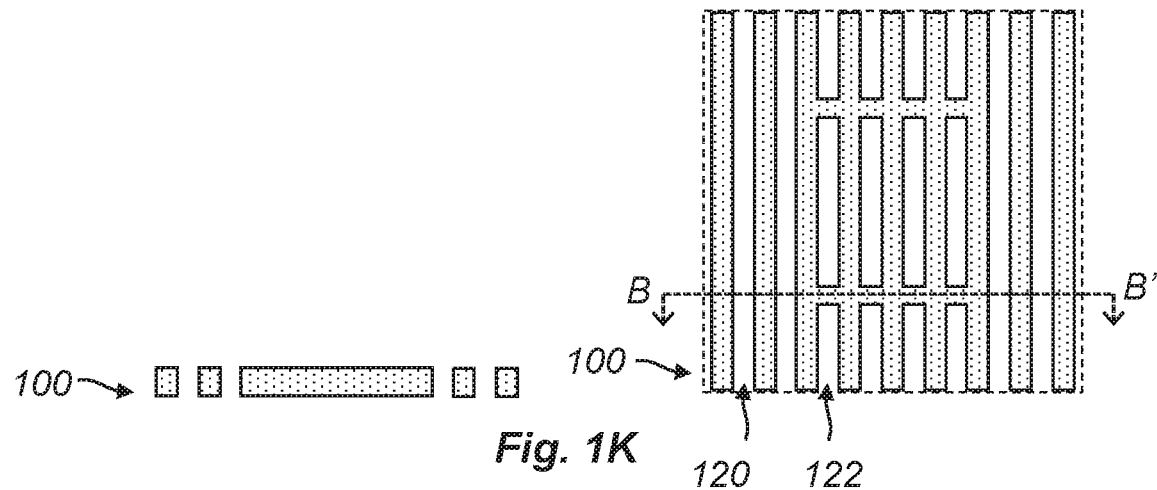

In FIG. 1K, the line mask 102, the remaining parts 114ac, 114bc of the first and second sidewall spacer portions 114a, 114b and the remaining portions of the buffer layer 104 and the planarization layer 104 have been removed to allow a view of the resulting pattern in the target layer 100. Accordingly, a set of trenches 120, 122 have been formed in the target layer 100, wherein the trenches 122 formed below the gaps 103a-e shown in FIG. 1I are interrupted along the longitudinal direction Y.

A location of a trench interruption defines a position of a trench tip-to trench-tip location, or shorter tip-to-tip location. The tip-to-tip distance represent the critical dimension of the trench interruption. Due to manner in which the trench interruptions are formed, the tip-to-tip distance may present a comparably small variability, both for an individual trench as well as in-between different trenches. By way of illustration, sidewall spacers with a thickness of about 2 nm or less and a line width roughness of 0.3 nm or less is readily achievable, for instance using plasma enhanced atomic layer deposition (PEALD) techniques. This translates to a correspondingly small local tip-to-tip variability (i.e. in one or more adjacent trenches) and global tip-to-tip variability (i.e. on wafer level).

In a variation of the above method, following the forming of the sidewall spacer 114, the mandrel mask 112 may be removed and the entire pattern of the sidewall spacer 114 may be transferred into the buffer layer 106. A pattern corresponding to the pattern of the sidewall spacer 114 may thus be formed in the buffer layer 106. The buffer layer pattern may thereafter be partially removed such that only transversely extending parts of the buffer layer pattern remain. Block masks including transversely extending parts corresponding to (parts of) the first and/or second sidewall space portions 114a/114ac and 114b/114bc may hence be formed. The partial removal of the buffer layer pattern may be achieved by forming a cut mask corresponding to the cut mask 116 discussed above. An etch stopping layer may be formed underneath the buffer layer. This may facilitate the partial removal of the buffer layer pattern. The stopping layer and the buffer layer may be formed of different materials, for instance different hard mask materials. The process may thereafter proceed in analogy with the above by patterning the layer 104 and subsequently the target layer 100.

Figure 2A:
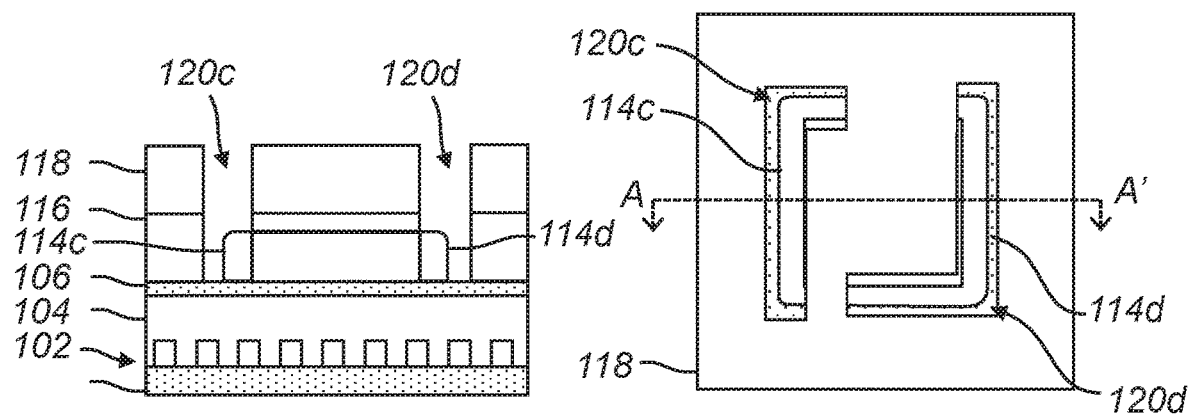
FIGS. 2A-C schematically illustrate a method for patterning a target layer, according to an example embodiment.
Figure 2B:
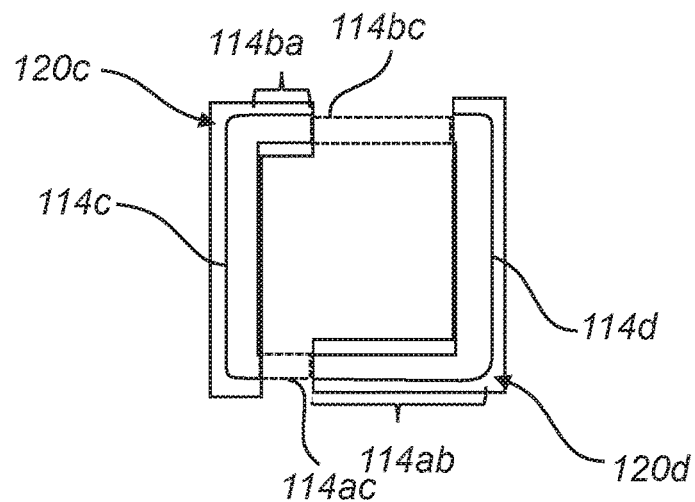
Figure 2C:
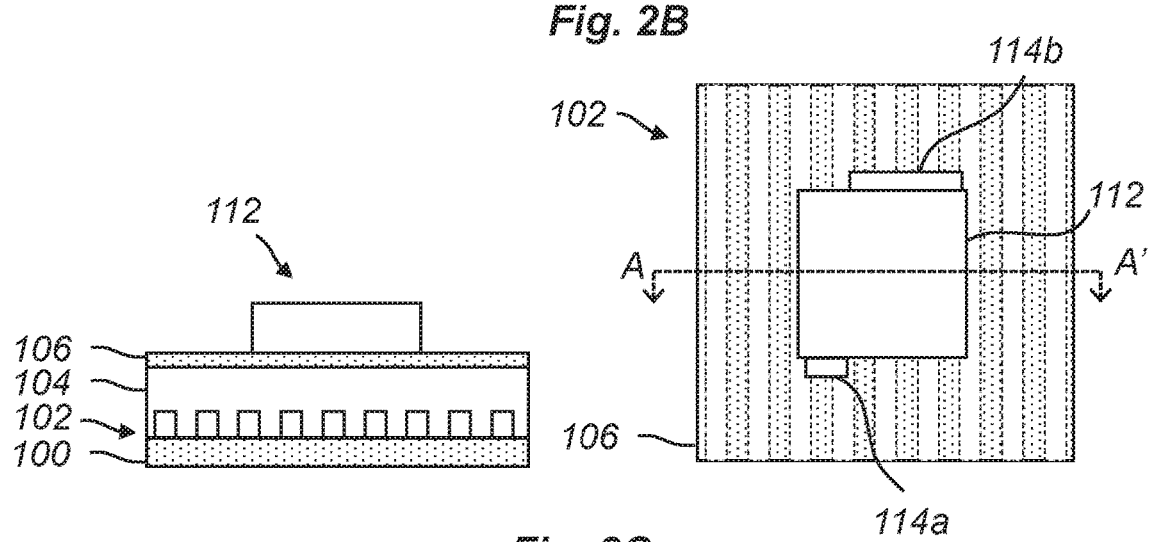

As described above, the openings 120c, 120d may be formed to expose also the peripheral parts 114aa, 114ab, 114ba, 114bb of the first and second sidewall spacer portions 114a, 114b. This is however optional and it is possible to also form the openings 120c, 120d such that none or only some of the peripheral parts 114aa, 114ab, 114ba, 114bb are exposed. It is also possible to form the openings 120c, 120d in such a manner that even greater parts of the first and second sidewall spacer portions 114a, 114b are removed. This is illustrated in FIG. 2A-C wherein openings 120c, 120d in the cut mask layer 116 are formed to expose further parts of the sidewall spacer 114. As shown in FIGS. 2A and 2B, the opening 120c exposes the third sidewall spacer portion 114c and an extended peripheral part 114ba of the second sidewall spacer portion 114b. Meanwhile, the opening 114d exposes the fourth sidewall spacer portion 114d and an extended peripheral part 114ab of the first sidewall spacer portion 114a. The remaining parts 114ac and 114bc of the first sidewall spacer portion 114a and the second sidewall spacer portion 114b, respectively, may hence be formed to present different length dimensions and to define trench interruptions for different subsets of trenches. In a further variation of the method, one or more of the first and the second sidewall spacer portions 114a, 114b may be sectioned into two or more sections. It is even possible to completely remove the first or the second sidewall spacer portion 114a, 114b.

Figure 3A:
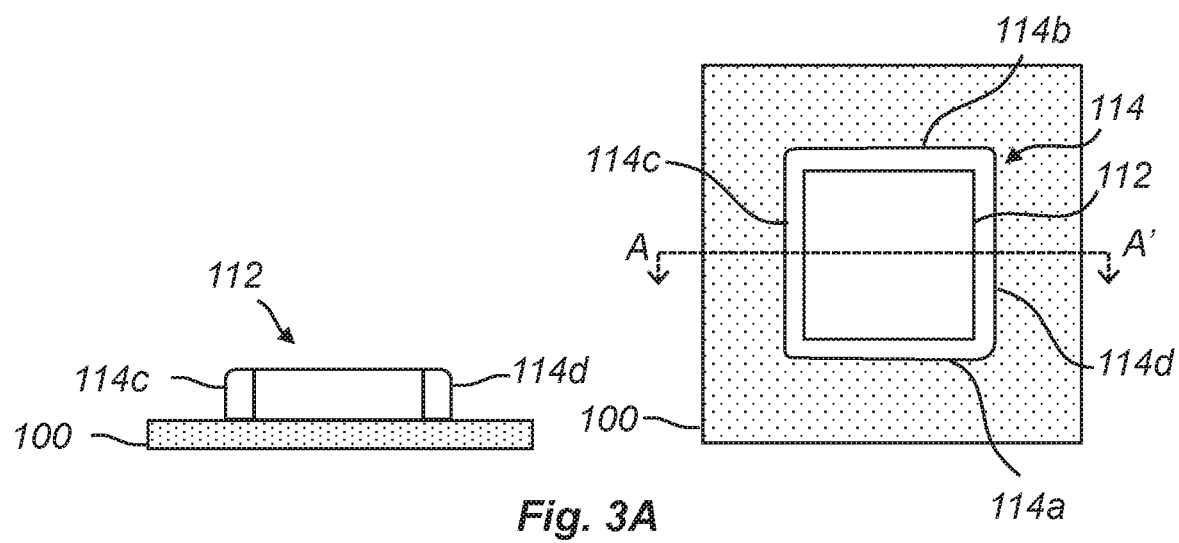
FIGS. 3A-C schematically illustrate a method for patterning a target layer, according to an example embodiment.
Figure 3B:
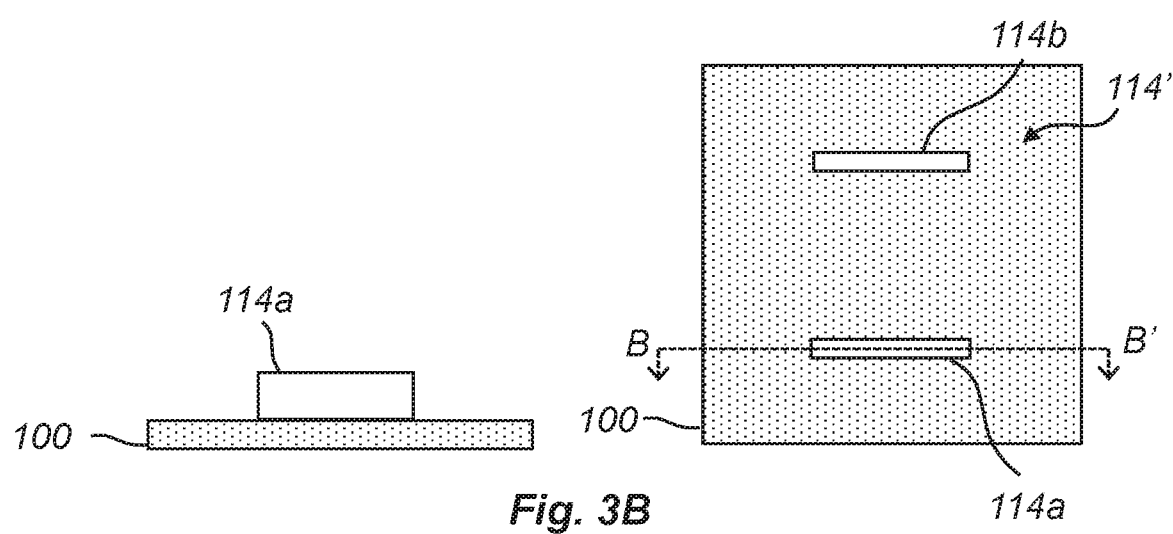
Figure 3C:
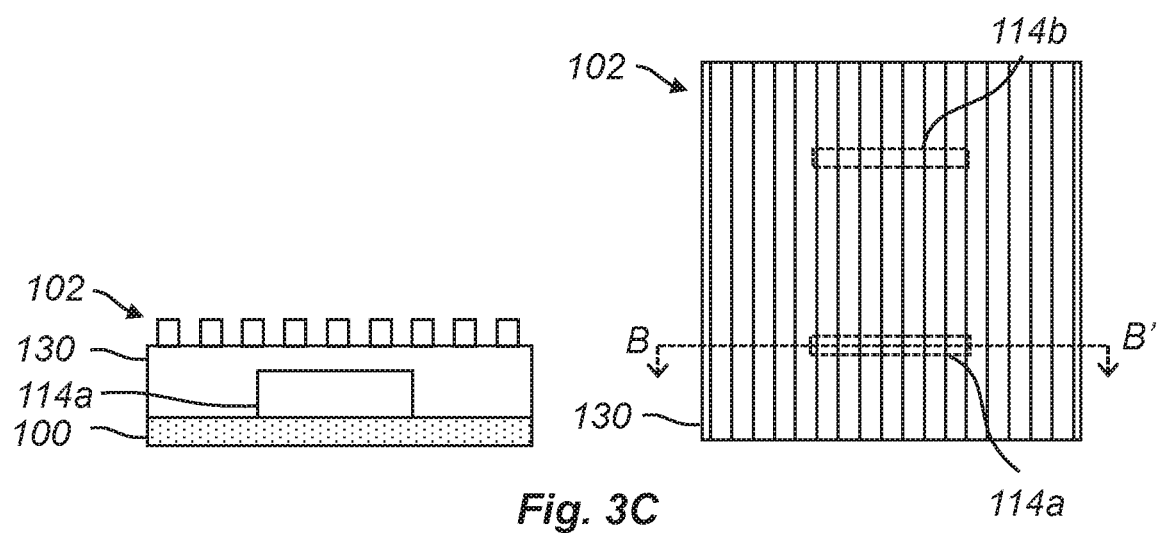

FIG. 3A-C illustrates a variation of the method shown in FIGS. 1A-K. The method generally includes forming of the same layers and features as in the method shown in FIG. 1A-K. In the method show in FIG. 1A-K the mandrel mask 112 was formed above the line mask 102, in a "block last" approach. In the variation shown in FIGS. 3A-C the line mask 102 is instead formed above the mandrel mask 112, in a "block first" approach.

Accordingly, in FIG. 3A, the mandrel mask 112 is formed on the target layer 100. The sidewall spacer 114 is formed on the sidewalls of the mandrel mask 112. In FIG. 3B, the sidewall spacer 114 has been partially removed such that the first sidewall spacer portion 114a and the second sidewall spacer portion 114b remains. The mandrel mask 112 has also been removed. In FIG. 3C a planarization layer 130, corresponding to the planarization layer 104 has been formed to cover the remainder 114' of the sidewall spacer 114. The line mask 112 has been formed on the planarization layer 130. The method may thereafter proceed in analogy with FIG. 1I by transferring the pattern of the line mask 102 into the planarization layer 130 such that the transverse "block masks", defined by the respective first and second sidewall spacer portions 114ac, 114bc, are exposed with longitudinal extending line features, defined by the lines 102, extending across the block masks. Subsequently, a pattern defined jointly by the first and second sidewall spacer portions 114a, 114b and the line mask 102 may be transferred into the target layer 100 to form trenches including interrupted trenches.

Figure 4A:
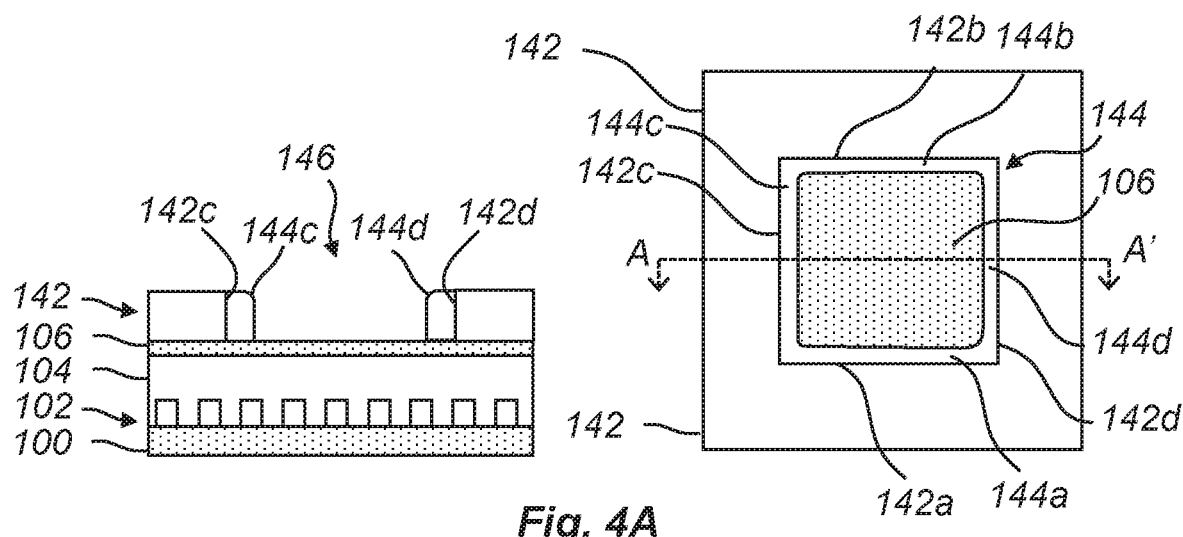
FIGS. 4A-B schematically illustrate a method for patterning a target layer, according to an example embodiment.
Figure 4B:
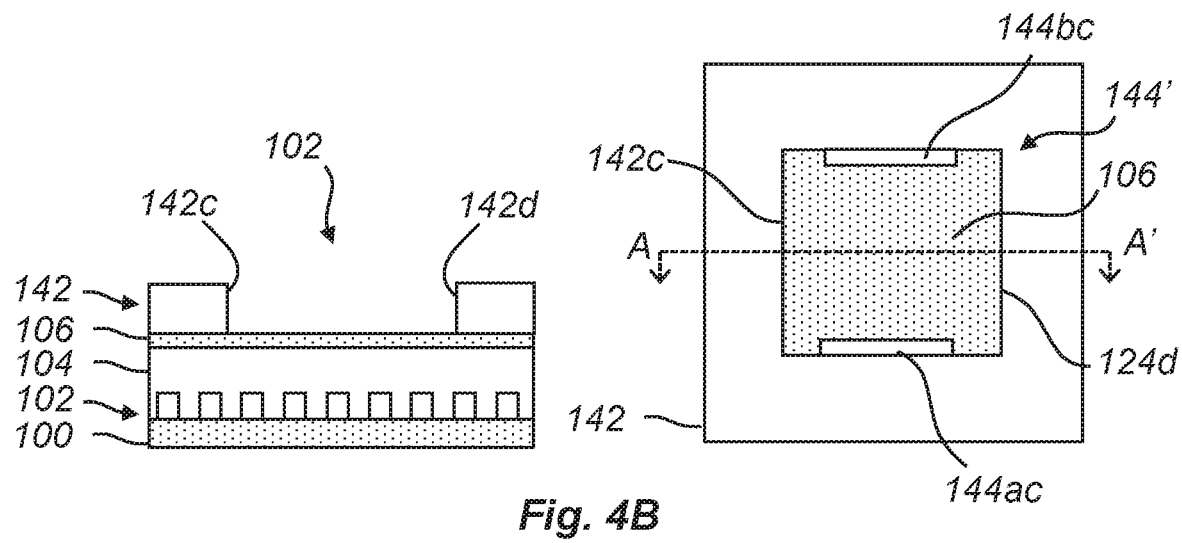

FIG. 4A-B illustrates a further variation of the method shown in FIGS. 1A-K. The method generally includes forming of the same layers and features as in the method shown in FIG. 1A-K. In the variation shown in FIGS. 4A-C a mandrel mask 142, corresponding to the mandrel mask 112, is instead formed by forming an opening 146 in the mandrel mask layer. The sidewalls 142a-d of the mandrel mask 142 hence form inwardly facing sidewalls. As shown in FIG. 4A, the sidewalls 142a-d may subsequently be provided with a sidewall spacer 144, corresponding to the sidewall spacer 114, and including first through fourth sidewall spacer portions 144a-d. In FIG. 4B the sidewall spacer 144 has been partially removed such that respective parts 144ac, 144bc of the first and second sidewall spacer portions 144a, 144b, respectively, remain on the first and second sidewall. The method may then proceed in analogy with FIG. 1H by removing the mandrel mask 142.

In the above, the disclosure has mainly been described with reference to a limited number of examples. However, as is readily appreciated by a person skilled in the art, other examples than the ones disclosed above are equally possible within the scope of the disclosure, as defined by the appended claims.

For instance, in the illustrated methods, only a single mandrel mask 112, 142 is shown. However, it is also possible to form two or more mandrel masks in the mandrel mask layer 108, at different positions and optionally with different lateral dimensions. Referring to the rectangular mandrel mask 112, 142 it is also possible to form a mandrel mask 112, 142 as a non-rectangular feature, as long as the mandrel mask has at least one sidewall extending transverse to the longitudinal direction of the lines 102. A mandrel mask may for instance be formed as a triangular feature. Moreover, although in the illustrated methods the mandrel mask 112, 142 is removed subsequent to the partial removal of the sidewall spacer 114, 144 it is also possible to remove the mandrel mask 112, 142 prior to partially removing of the sidewall spacer 114, 144.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for patterning a target layer, the method comprising:
   forming above the target layer a line mask and a mandrel mask, wherein forming the line mask comprises forming parallel material lines extending in a longitudinal direction, wherein forming the mandrel mask comprises forming the mandrel mask having sidewalls including at least a first sidewall extending transverse to a plurality of the parallel material lines;

forming on the sidewalls of the mandrel mask a sidewall spacer including a first sidewall spacer portion extending along the first sidewall;

partially removing the sidewall spacer such that a remainder of the sidewall spacer comprises at least a part of the first sidewall spacer portion extending along the first sidewall transverse to the plurality of the parallel material lines;

removing the mandrel mask; and transferring into the target layer a pattern defined by the line mask and the remainder of the sidewall spacer.

2. The method according to claim 1, wherein partially removing the sidewall spacer comprises partially removing the first sidewall spacer portion such that the remainder of the sidewall spacer comprises a remaining part of the first sidewall spacer portion.

3. The method according to claim 2, wherein the remaining part of the first sidewall spacer portion has a first end and a second end, the first end being aligned with a first material line of the line mask and the second end being aligned with a second material line of the line mask.

4. The method according to claim 1, wherein partially removing the sidewall spacer comprises removing at least a first and a second peripheral part of the first sidewall spacer portion.

5. The method according to claim 1, wherein transferring the pattern into the target layer comprises etching the target layer using the line mask and the at least a part of the first sidewall spacer portion as an etch mask.

6. The method according to claim 1, wherein the mandrel mask is formed on a buffer layer and wherein transferring the pattern into the target layer comprises transferring a pattern defined by the remainder of the sidewall spacer into the buffer layer to form a patterned buffer layer, and subsequently transferring a pattern defined by the line mask and the patterned buffer layer into the target layer.

7. The method according to claim 1, wherein the sidewalls of the mandrel mask further comprise a second sidewall extending transverse to the plurality of the parallel material lines, and the sidewall spacer further comprises a second sidewall spacer portion extending along the second sidewall, and wherein partially removing the sidewall spacer comprises partially removing the sidewall spacer such that the remainder of the sidewall spacer further comprises at least a part of the second sidewall spacer portion.

8. The method according to claim 7, wherein partially removing the sidewall spacer further comprises removing at least a first and a second peripheral part of the second sidewall spacer portion.

9. The method according to claim 7, wherein partially removing the sidewall spacer further comprises partially removing the second sidewall spacer portion such that the remainder of the sidewall spacer comprises a remaining part of the second sidewall spacer portion.

10. The method according to claim 9, wherein a remaining part of the second sidewall spacer portion has a first end and a second end, the first end being aligned with a third material line of the line mask and the second end being aligned with a fourth material line of the line mask.

11. The method according to claim 1, wherein the sidewalls of the mandrel mask further comprise third and fourth sidewalls extending along the parallel material lines, and the sidewall spacer further comprises a third sidewall spacer portion extending along the third sidewall and a fourth sidewall spacer portion extending along the fourth sidewall, and wherein partially removing the sidewall spacer comprises removing the third and fourth sidewall spacer portions.

12. The method according to claim 1, wherein partially removing the sidewall spacer comprises:
    forming a cut mask layer above the sidewall spacer;
    forming at least one opening in the cut mask layer to expose parts of the sidewall spacer; and
    removing the exposed parts of the sidewall spacer by etching through the at least one opening.

13. The method according to claim 1, wherein the mandrel mask is formed above the line mask.

14. The method according to claim 1, wherein the line mask is formed above the mandrel mask.

15. The method according to claim 1, wherein the sidewalls of the mandrel mask are outwardly facing sidewalls or inwardly facing sidewalls.

16. A method for patterning a target layer, the method comprising:
    forming above the target layer a line mask and a mandrel mask and a buffer layer, wherein forming the line mask comprises forming parallel material lines extending in a longitudinal direction, wherein forming the mandrel mask comprises forming the mandrel mask above the buffer layer, the mandrel mask having sidewalls comprising at least a first sidewall extending transverse to a plurality of the parallel material lines;
    forming, on the sidewalls of the mandrel mask, a sidewall spacer comprising a first sidewall spacer portion extending along the first sidewall;
    removing the mandrel mask;
    transferring a pattern defined by the sidewall spacer into the buffer layer, thereby forming a patterned buffer layer;
    partially removing the patterned buffer layer such that a remainder of the patterned buffer layer comprises at least one part that extends transverse to the plurality of the parallel material lines; and
    transferring into the target layer a pattern defined by the line mask and the at least one transversely extending part.

* * * * *